US006948014B2

(12) United States Patent
Dietrich et al.

(10) Patent No.: US 6,948,014 B2
(45) Date of Patent: Sep. 20, 2005

(54) REGISTER FOR THE PARALLEL-SERIAL CONVERSION OF DATA

(75) Inventors: Stefan Dietrich, Turkenfeld (DE); Peter Schroegmeier, Munich (DE)

(73) Assignee: Infineon Technologies AG, München (DE)

(*) Notice: Subject to any disclaimer, the term of this patent is extended or adjusted under 35 U.S.C. 154(b) by 270 days.

(21) Appl. No.: 10/396,966

(22) Filed: Mar. 25, 2003

(65) Prior Publication Data

US 2003/0188064 A1 Oct. 2, 2003

(30) Foreign Application Priority Data

Mar. 28, 2002 (DE) ......................................... 102 14 123

(51) Int. Cl.[7] .............................................. B06F 13/12
(52) U.S. Cl. ...................... 710/71; 708/204; 708/209; 365/240; 365/189.12
(58) Field of Search ................................ 365/230, 240, 365/189; 708/209, 204–208; 710/62–74; 711/104, 207; 714/799

(56) References Cited

U.S. PATENT DOCUMENTS

| | | | | | |
|---|---|---|---|---|---|
| 3,938,081 | A | * | 2/1976 | Kirk ........................... | 714/799 |
| 4,543,644 | A | * | 9/1985 | Kozima et al. ............. | 711/104 |
| 4,675,842 | A | * | 6/1987 | Szenes et al. ............... | 711/207 |
| 4,779,223 | A | * | 10/1988 | Asai et al. ................... | 710/26 |
| 4,969,126 | A | * | 11/1990 | Maeno ........................ | 365/240 |
| 5,467,311 | A | | 11/1995 | Wiedmann et al. | |
| 5,551,009 | A | | 8/1996 | Amini et al. | |
| 5,619,455 | A | | 4/1997 | Akiyama et al. | |
| 5,768,630 | A | * | 6/1998 | Kim ............................. | 710/71 |
| 5,841,681 | A | * | 11/1998 | Chen et al. ................. | 708/300 |
| 6,018,754 | A | * | 1/2000 | Chen et al. ................. | 708/316 |
| 6,493,794 | B1 | | 12/2002 | Yamashita | |

FOREIGN PATENT DOCUMENTS

JP 11-328947 A 11/1999

OTHER PUBLICATIONS

Fairchild Semiconductor "CD4094BC–Bit Shift Register/Latch with 3–State Outputs", Jan. 1999.
Lawrence, J.A., "Increased Valid–Data Readout Time in Static RAM" IBM TDB, vol. 25, No. 6, Nov. 1982.
MICRON "General DDR SDRAM Functionality" TN–46–05, Jul. 2001.
Ryan, K., "DDR SDRAM Functionality and Controller Read Data Captuer", MICRON DesignLine, vol. 8, Issue 3, pp. 21–24, 3Q 1999.

* cited by examiner

*Primary Examiner*—Christopher Shin
(74) *Attorney, Agent, or Firm*—Jenkins, Wilson & Taylor, P.A.

(57) ABSTRACT

Register for the parallel-serial conversion of data having a plurality of cyclically driven shift registers (2), each comprising series-connected data holding elements (3), each data holding element (3) being connected to a data input line (5), each shift register (2), upon receiving an input control signal (INP) for the shift register (2), loading the data present on the data input lines (5) into the data holding elements (3) connected thereto; each shift register (2), upon receiving an output control signal (OUTP) for the shift register (2), outputting the datum buffer-stored in the last data holding element of the shift register (2), in which case there is connected downstream of each shift register (2) a further data holding element (10), which, upon receiving an input control signal (INP) for loading the preceding shift register (2), is preloaded with the datum for the first data holding element (3-3) of the shift register (2) and, upon reception of the output control signal (OUTP) for the shift register (2), outputs said preloaded datum to an output data line (22) via a data signal driver (18) for generating a serial output data stream with unambiguous data signal states.

22 Claims, 8 Drawing Sheets

REGISTER FOR THE PARALLEL-SERIAL CONVERSION OF DATA

TECHNICAL FIELD

The invention relates to a register for the parallel-serial conversion of data which is suitable in particular for the use of a DRAM memory.

BACKGROUND ART

D-RAM modules are standard memory modules for main memory. D-RAM memories comprise large scale integrated transistors and capacitors. In order to maintain the information, the memory content has to be continually refreshed in this case (refresh). A synchronous D-RAM (S-DRAM) permits the memory access without additional waiting cycles. In this case, the data transfer between the S-DRAM and an external data bus is effected synchronously with the external clock signal.

FIG. 1 shows an S-DRAM memory module according to the prior art. The S-DRAM memory module is connected to an external control bus, to an external address bus and to an external data bus. Via command PADS, the control commands present on the external control bus are read in by an integrated command receiver and the reception signals are applied, after having undergone signal amplification, to a command decoder. The command decoder decodes the applied control commands, which have a width of 4 bits, for example, to form internal control commands, such as, for instance, write (WR) and read (RD). The S-DRAM comprises a state machine or a sequence controller which controls the internal sequences in a manner dependent on the decoded internal control commands. The sequence controller is clocked by a clock signal. For this purpose, an external clock signal $CLK_{ext}$ is applied to the S-DRAM and signal-amplified by an integrated clock signal receiver. The amplified clock signal is distributed by a clock tree in a tree-like manner in the integrated S-DRAM and passes via an internal clock line to a sequence controller. The external clock signal is furthermore applied to a delay locked loop DLL. The delay locked loop DLL effects a negative phase shift of the external clock signal CLK that is present. The internal DLL clock signal leads the external clock signal in order that the data are present synchronously with the external clock signal at the data pads. The output signal driver OCD (off chip driver) of a data path, said output signal driver being integrated in the S-DRAM, is clocked with the DLL clock signal $DLL_{CLK}$. Connected downstream of the delay locked loop DLL is a propagation time element which forms an internal clock signal (VE-CLK) which is simulated identically to the external clock signal, i.e. VE-CLK is completely synchronous with $CLK_{ext}$. The propagation time element in this respect compensates for the negative phase shift of the delay locked loop DLL.

The internal sequence controller generates control signals for the internal operating sequence of the S-DRAM in a manner dependent on the decoded commands. The sequence controller generates an RAS signal (row address strobe) for driving a row address latch and a CAS signal (column address select) for driving a column address latch. The row address latch and the column address latch are connected to an address signal receiver of the S-DRAM via an internal address bus. The S-DRAM receives an external address via the external address bus at the address PADS, the address signals present being signal-amplified by an address receiver. In order to save terminals, the address is input in two steps in DRAM memories. In a first step, the row address bits are loaded with the RAS signal into the row address latch. In a second step, the column address bits are loaded with the CAS signal into the column address latch. The address bits are applied to a row and column decoder, respectively, for access to a memory cell within the matrix-type memory cell array. The row address latch and the column address latch and also the row decoder and column decoder together form an address signal decoder. For the refresh of the memory cells, the sequence controller generates a refresh control signal. A refresh counter, which receives said refresh signal from the sequence controller, successively generates all existing row addresses, which are then applied to the address bus. The sequence controller generates an RAS control signal for this purpose. All the word lines are activated in this way. Through the activation of a word line, all the memory cells connected to it are refreshed.

The memory cell array is furthermore connected to read/write amplifiers. The number of read/write amplifiers depends on the memory architecture, the word width and the prefetch. Given prefetch 4 with a word width of 32, by way of example, 128 read/write amplifiers are in operation simultaneously. If four independent memory banks are provided, for example, a total of 512 read/write amplifiers are integrated on the memory chip.

Via the read/write amplifiers, a data bit is in each case written to an addressed memory cell or read from it. The read/write amplifiers are connected to an internal data path of the S-DRAM via an internal data bus. Via the data path, the data present in the external data bus are written to the S-DRAM synchronously and output from the S-DRAM synchronously. The data path is connected to the data PADS of the S-DRAM.

For reading in the data, the data path acquires a data receiver for receiving the data that are present externally. An internal driver circuit for the data to be written (WR driver) carries out a signal amplification of the received data and outputs the read-in data to the read/write amplifiers via the internal bus. The driver circuit WR driver is driven by a write latency generator which is clocked by the internal clock signal VE-CLK. For its part, the write latency generator is connected to a decoder.

For synchronous outputting of data, the data path contains a data FIFO register, downstream of which an output data driver circuit (OCD driver) is connected. The FIFO register is driven by the read/write amplifier by means of an input pointer and by a read latency generator by means of an output pointer or a time-delayed data enable signal. The read latency generator is likewise connected to a decoder.

The two decoders for the read latency generator and the write latency generator are connected via internal control lines to a mode register in which the data for controlling the operating modes within the S-DRAM are stored. The mode register can be initialized by a mode register set command via the internal address bus. The mode register is initialized after the switch-on. Before external control commands are applied to the S-DRAM, the mode register is initialized. The mode register contains control data for the CAS latency, for test modes and for a DLL reset.

The sequence controller generates, in a manner dependent on the external control commands, an internal write command PAW for activating the write latency generator and an internal read command PAR for activating the read latency generator.

FIG. 2 shows the FIFO register contained in the data path of the S-DRAM memory. The FIFO memory is on the one hand connected to the internal data bus of the S-DRAM and is on the other hand connected, on the output side, to the OCD driver. Via the data input lines of the internal data bus, the FIFO register receives the data to be output and outputs them via data output lines to the OCD driver connected downstream. Since the bus width of the internal data bus is higher than the bus width or word width of the external data bus by a prefetch factor PF of the S-DRAM, a parallel-serial conversion of the data is effected by the FIFO register. If the S-DRAM has a word width of 32 bits, for example, i.e. if the external data bus has 32 data bit lines, the bus width of the internal data bus given a prefetch factor of four is four times thirty-two bits, i.e. 128 data lines. The internal data bus therefore comprises four logical internal data buses each comprising a word width of 32 bits. The corresponding data bits, i.e. data bit 0 to data bit 31 of the four logical internal data buses (Load 0, Load 1, Load 2, Load 3) are respectively connected to a conventional FIFO data register, as is illustrated in FIG. 3.

FIG. 3 shows a FIFO register according to the prior art for the parallel-serial conversion of data. The FIFO register contains a plurality of shift registers SR each comprising series-connected data holding elements DHG. The number of series-connected data holding elements DHG corresponds to the number of data input lines connected in parallel. In the case of the S-DRAM memory illustrated in FIG. 1, each FIFO register element, as is illustrated in FIG. 3, has four data input lines, i.e. the width of a shift register SR is equal to the prefetch factor PF of the S-DRAM memory and has a value of four. With the rising signal edge of the output control signal OUTP and also with the falling signal edge of the output control signal OUTP, the data holding elements $DHG_i$ accept a datum from the data holding element $DHG_{i-1}$ connected upstream and forward the datum to a data holding element $DHG_{i+1}$ connected downstream. In this case, a data holding element DHG may comprise two flip-flops driven in antiphase or flip-flops which, on both signal edges, can simultaneously receive new data and pass on the previous data. The data holding elements DHG are driven by input control signals (Input) and by output control signals (Output). The data holding elements of the various shift registers SR are driven cyclically for reading in and outputting data.

A data input indication signal is fed to a first counter, which cyclically outputs input control signals to the shift registers SR. In the case of an S-DRAM, the data input indication signal is generated by the read/write amplifier circuit and transmitted to the FIFO register. The data input indication signal indicates to the FIFO register that the data present on the internal data bus are valid and can be accepted.

The read latency generator S-DRAM generates a data output indication signal and feeds it to two different counters within the FIFO register. One counter cyclically generates data output control signals (Output) and cyclically drives the data holding elements of the shift registers SR therewith. The data output indication signal is furthermore fed to a counter for generating enable signals (EN) for cyclically driving data signal drivers.

The FIFO register according to the prior art as illustrated in FIG. 3 has a register depth N, i.e. N storage registers SR are provided which can be loaded one after the other. The loading or filling of a shift register SR takes place by means of the associated input pointer or the associated input control signal.

Each shift register SR has a register width M, which has a value of four in the example illustrated in FIG. 3. The width M of the shift register is equal to the prefetch factor PF of the S-DRAM.

The depth N of the FIFO register is chosen in a manner dependent on the prefetch factor PF, the maximum CAS read latency and the minimum permitted interval between two read accesses. In a preferred embodiment, the depth N of the FIFO register likewise has a value of four, by way of example.

The data bits loaded into the FIFO register originate from the memory cell array and are fed to the FIFO register via the internal data bus. The four loaded data bits are driven onto the same input-output data pad of the external data bus. The read-out of the FIFO register takes place by means of a so-called output pointer (Output), each shift register SR cyclically receiving an associated output control signal from the counter.

FIG. 5 shows the signal sequences in a FIFO register for the parallel-serial conversion of data. The FIFO register is clocked with a clock signal CLK which is formed by the DLL-CLK clock signal in the case of the S-DRAM memory illustrated in FIG. 1. The four data bits (load[0:3]) that are to be read into the FIFO register are present on the data bus lines of the internal data bus. In the example illustrated in FIG. 5, the FIFO register has a depth N of four, i.e. contains four shift registers SR. The internal counter of the FIFO register generates, from the data input indication signal, four input control signals (INP0 to INP4) for the four shift registers SR. The input control signal in each case comprises an individual signal pulse.

From the data output indication signal originating from the read latency generator, the second counter generates data output control signals (Output 0 to Output 3) for the four shift registers SR, each data output control signal (Output) comprising two signal pulses with four signal edges. The number of signal edges of the data output control signal for a shift register SR corresponds to the width M of the shift register SR, i.e. likewise four signal edges in the example illustrated in FIG. 3. Furthermore, a signal generator generates an enable control signal EN for the four data signal drivers.

The FIFO register according to the prior art as illustrated in FIG. 3 has the disadvantage that undefined data intermediate states, so-called data garbage, can occur during a changeover operation from the read-out of a first shift register ($SR_i$) to the read-out of the next shift register ($SR_{i+1}$). This is due to the fact that the enable control signal for the data output drivers does not occur with absolutely accurate timing with the associated data output control signal, i.e. the enable signal is not exactly time-synchronous with the associated output pointer signal for the storage register. The undefined data states occur since the enable signal (EN) already opens the data driver stage when the incorrect data value is still being driven from the shift register. Undefined data states arise since the signal edges of the control signals are not infinitely steep or the switching operation requires a finite time.

If, as can be seen from FIG. 5, the enable control signal En0 for the data output driver of the first shift register SR0 has a rising signal edge, the associated data output driver is activated. Afterward, the shift register SR0 receives the data output control signal (OUTP0) with four signal edges, namely two rising signal edges and two falling signal edges. With each signal edge of the data output control signal (OUTP0), the data content of the last data holding element $DH_0$ of the shift register $SR_0$ is driven on by the data output driver. In order that the Load 3 data bit which was originally loaded into the data holding element $DHG_3$ of the shift register $SR_0$ is also driven onto the data output line for the entire pulse width of a pulse of the data output control signal (OUTP0), i.e. for half the cycle time of the clock signal CLK, the enable control signal En0 would have to be completely contemporaneous or synchronous with the rising signal edge of the data output control signal (OUTP1) for the next shift register $SR_1$ and with the rising signal edge of the associated enable control signal $EN_1$. This cannot be guaranteed, however, since the switching operation requires a finite time or the control signal edges are not infinitely steep. In the serial data output stream, therefore, an undefined data state arises in the transition region and continues via the data output driver OCD on the external data bus. This makes it considerably more difficult for a connected processor to accept the data because the width of the data eyes for the valid data becomes narrower. In particular at very high clock rates of a few hundred megahertz, the undefined data states can lead to an error in the data acceptance by the data processor.

SUMMARY OF THE INVENTION

Therefore, the object of the present invention is to provide a register for the parallel-serial conversion of data which minimizes the duration of the undefined data states on the data output lines.

This object is achieved according to the invention by means of a register having the features specified in patent claim 1.

The invention provides a register for the parallel-serial conversion of data having
- a plurality of cyclically driven shift registers (SR), each comprising series-connected data holding elements (DHG), each data holding element (DHG) being connected to a data input line;
- each shift register (SR), upon receiving an input control signal (INP) for the shift register (SR), loading the data present on the data input lines into the data holding elements (DHG) connected thereto;
- each shift register (SR), upon receiving an output control signal (OUTP) for the shift register (SR), outputting the datum buffer-stored in the last data holding element of the shift register,
- in which case, in the register according to the invention, there is connected downstream of each shift register (SR) a further data holding element (DHG), which, upon receiving the input control signal (INP) for loading the preceding shift register, is preloaded with the datum (Load 3) for the first data holding element (DHG-3) of the shift register (SR) and, upon reception of the output control signal (OUTP) for the shift register, outputs said preloaded datum to an output data line via a data signal driver for generating a serial output data stream with unambiguous data signal states.

The input control signals (INP) for the shift registers (SR) will preferably be generated by a first counter, the first counter outputting the input control signals (INP) cyclically to the shift registers (SR) after the reception of a data input indication signal which indicates the presence of data on the data input lines.

In a preferred embodiment of the register according to the invention, the output control signals (OUTP) for the shift registers (SR) are generated by a second counter, the second counter outputting the output control signals (OUTP) cyclically to the shift registers after the reception of a data output indication signal.

The data signal drivers of the register are preferably tristate stages which are activated by an enable signal (EN).

In a preferred embodiment of the register according to the invention, the enable signals (EN) for the data signal drivers are generated by a third counter, which outputs the enable signals (EN) cyclically to the data output drivers after the reception of the data output indication signal.

The input control signals (INP) for the shift registers (SR) preferably comprise a single signal pulse for loading the data present on the data input lines.

In this case, in each case with the rising signal edge and with the falling signal edge of the output control signal (OUTP), the data holding elements ($DHG_i$) preferably accept a datum from the output of the data holding element ($DHG_{i-1}$) respectively connected upstream and output the datum to the input of the data holding element ($DHG_{i+1}$) respectively connected downstream.

The number of series-connected data holding elements (DHG) of the shift register (SR) is preferably equal to the number of connected data input lines.

The register according to the invention can preferably be connected in parallel with further registers of the same type between data input lines of a first data bus and data output lines of a second data bus.

The first data bus is preferably an internal data bus of a DRAM memory.

The serial output data streams are preferably applied to a driver circuit of the DRAM memory via the output data lines.

The number of output data lines is preferably equal to the word width of the DRAM memory.

The number of input data lines is preferably equal to the product of the word width of the DRAM memory and a prefetch factor (PF) of the DRAM memory.

In a preferred embodiment of the register according to the invention, the data input indication signal is generated by a read/write amplifier of the DRAM memory.

In a further embodiment of the register according to the invention, the data output indication signal is generated by a read latency generator of the DRAM memory.

In a particularly preferred embodiment of the register according to the invention, the output control signal for the shift registers (SR) in each case comprises a sequence of pulses, the number of pulses being equal to half the number of series-connected data holding elements (DHG) of the shift register (SR).

In a preferred embodiment of the register according to the invention, the number of series-connected data holding elements (DHG) of a shift register is equal to the prefetch factor (PF) of the DRAM memory.

The DRAM memory is preferably an S-DRAM memory.

The clock signal (CLK) for clocking the register according to the invention preferably has a clock rate of a few hundred megahertz.

The register according to the invention is preferably in the a Fifo register.

BRIEF DESCRIPTION OF THE DRAWINGS

Preferred embodiments of the register according to the invention are described below in order to elucidate features essential to the invention, with reference to the accompanying figures, in which.

DETAILED DESCRIPTION OF THE INVENTION

Figure 4:
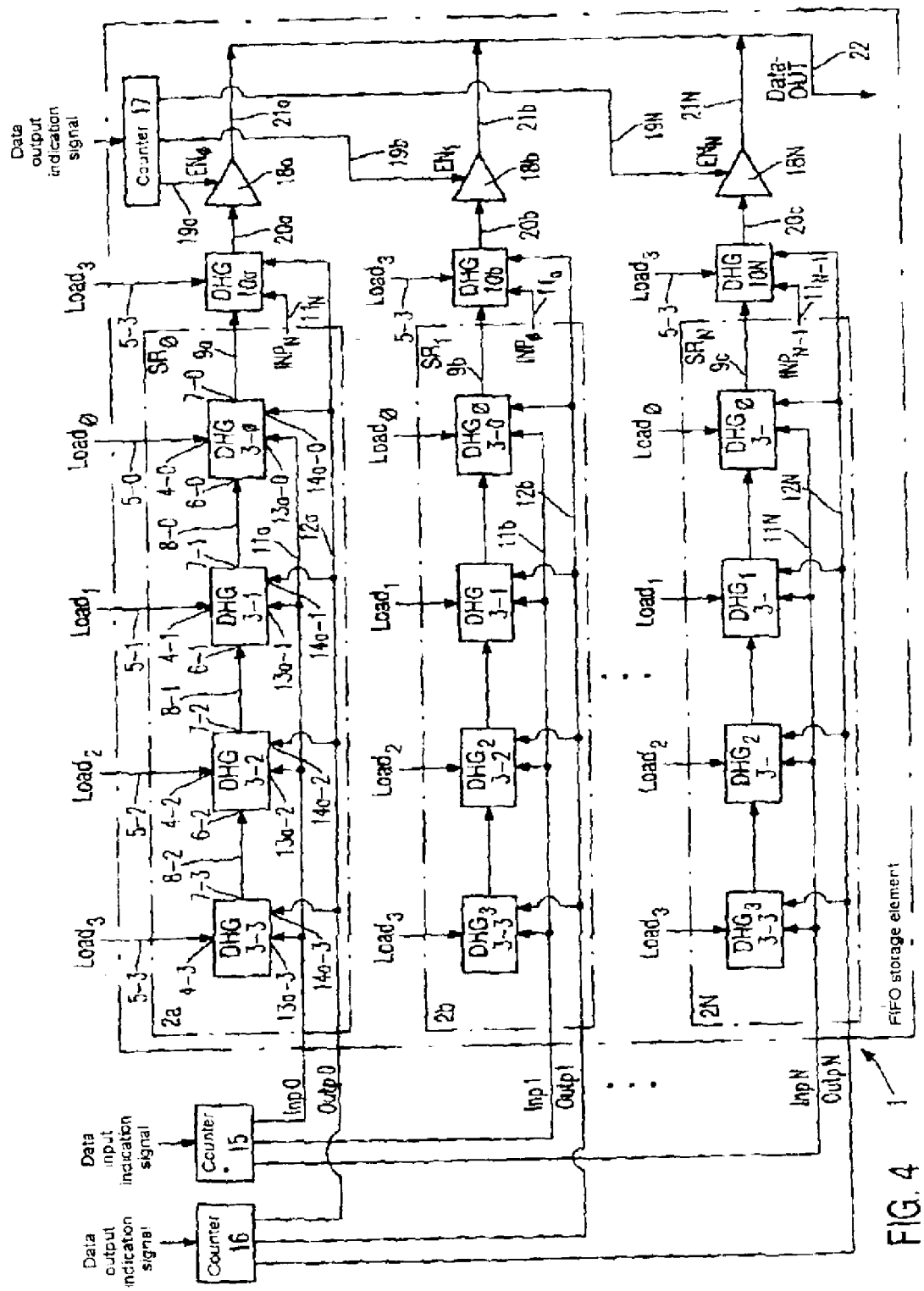
FIG. 4 shows a block diagram of a register for the parallel/serial conversion of data according to the invention.

FIG. 4 shows the circuitry construction of a preferred embodiment of the register 1 for the parallel/serial conversion of data according to the invention. The register 1 contains a plurality of shift registers 2a, 2b around point 2N. Each of these shift registers 2 comprises a plurality of series-connected data holding elements 3-0, 3-1, 3-2, 3-3. The data holding elements respectively have data inputs 4-0, 4-1, 4-2, 4-3, connected to data input lines 5-0, 5-1, 5-2, 5-3.

The data input lines 5 are part of a first data bus, for example the internal data bus of an S-DRAM memory. The number of shift registers 2-N is N, where N also designates the depth of the register 1.

In a preferred embodiment, the depth N of the Fifo register 1 is four. When the Fifo register is used within a DRAM memory, the register depth N is chosen in a manner dependent on the prefetch factor (PF), the maximum read latency and the minimum permitted interval between two read accesses.

The width M of the Fifo register 1, i.e. the number of data holding elements 3 connected in series in a shift register 2, is likewise four in the preferred embodiment of the register 1 as illustrated in FIG. 4. The width M of the register 1 is chosen to be equal to the prefetch factor (PF) for use within a DRAM memory.

The data holding elements 3 within the shift register 2 in each case have a further data input 6 and a data output 7. With the rising signal edge of the clock signal CLK and with the falling signal edge of the clock signal CLK, the data holding elements 3 in each case accept a datum from the output of the data holding element respectively connected upstream and forward this to the input of the data holding element respectively connected downstream. The data output 7 of a data holding element 7 is in each case connected via a line 8 to the input 6 of the data holding element connected downstream.

Upon reception of an input control signal (INP), the data holding elements 3 of a shift register 2 load the data present on the data input lines 5. Upon reception of an output control signal (OUTP) for the shift register 2, each shift register 2 outputs the datum buffer-stored in the last data holding element (3-0) of the shift register 2 via a line 9 to a data holding element 10 connected downstream.

The data holding elements 3 of a shift register receive the input control signal INP for the shift register via a common control line 11 to an input 13. The data holding elements 3 of one of the shift registers 2 furthermore receive the data output control signals via a common control line 12 at an input 14.

The control lines 11 for the input control signals are connected to a first counter 15 of the register. The control lines 12 for the data output control signals are connected to a second counter 16 of the register 1 according to the invention. The number of control lines 11, 12 for the input control signals (INP) and the output control signals (OUTP) corresponds to the depth N of the register 1 or the number of shift registers 2 within the register 1.

Figure 5:
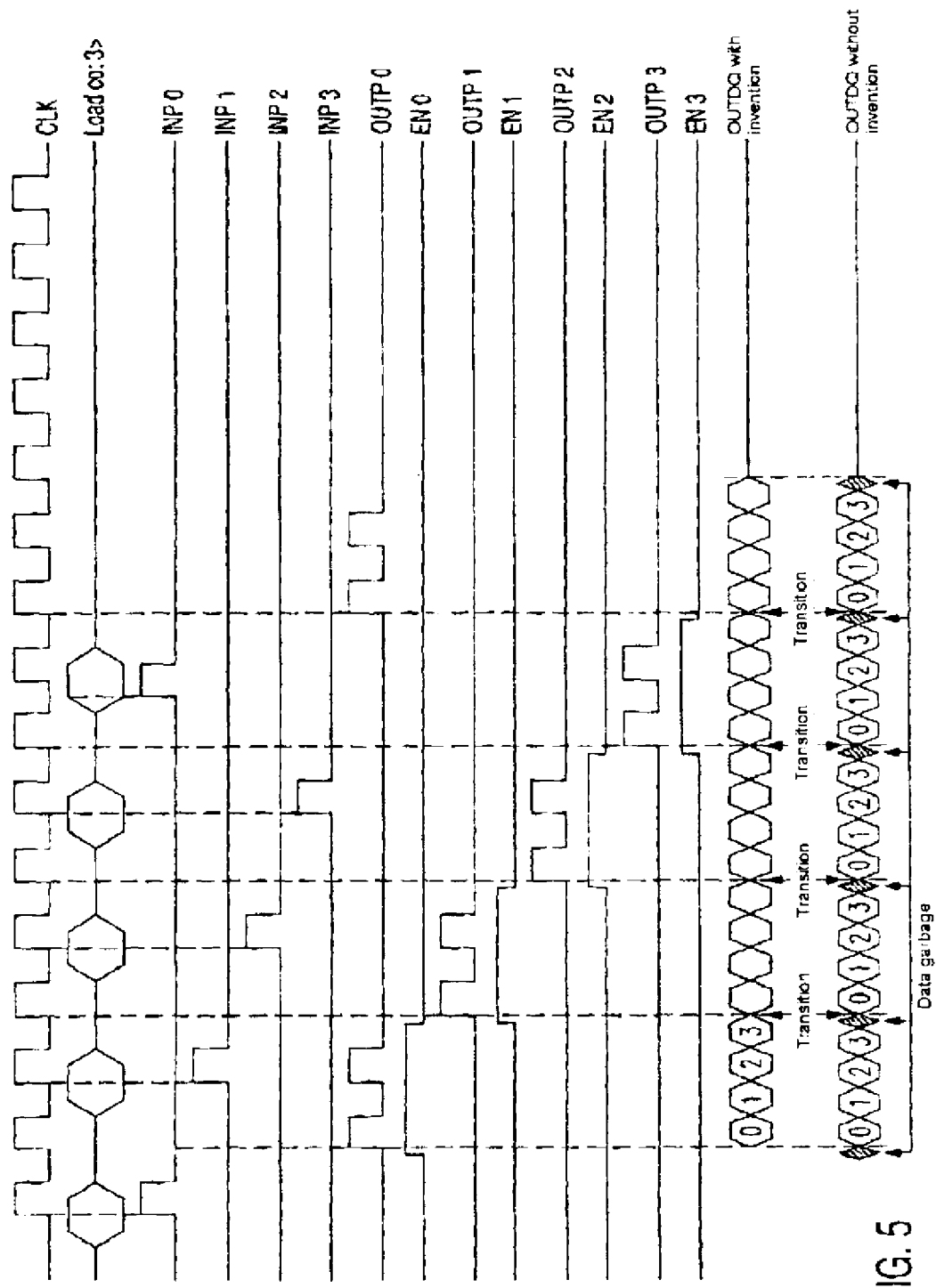
FIG. 5 shows timing diagrams for elucidating the method of operation of the register according to the invention in comparison with a conventional register.

The various input control signals (INP0, INP1, . . . INPN) for the various shift registers 2A–2N are generated by the first counter 15, the first counter 15, after receiving a data input indication signal which indicates the application of valid data on the data input lines 5, successively outputting input control signals (INP) to the shift registers 2-i. In this case, the input control signals (INP) preferably comprise a single signal pulse for loading the valid data present on the data input lines 5. FIG. 5 shows the input control signals INP0 to INP3 for four shift registers 2a, 2b, 2c, 2d.

With each input control signal (INP), a shift register 2-i is filled or loaded with the data present on the data input lines 5.

The various output control signals (OUTP0, OUTP1 . . . OUTPN) for the various shift registers 2a to 2N are generated by the second counter 16, the second counter 16, after receiving a data output indication signal, successively outputting the output control signals (OUTP) to the shift registers 2-i. In the embodiment of the register 1 according to the invention as illustrated in FIG. 4, the output control signals comprise two successive pulses, as illustrated in FIG. 5. The number of pulses is equal to half the number of series-connected data holding elements 3 within a shift register 2, i.e. the number of signal edges of the data output control signal is equal to the number of series-connected data holding elements, namely two rising signal edges and two falling signal edges. If the register 1 according to the invention is used in a DRAM memory, the number of series-connected data holding elements is chosen to be equal to the prefetch factor PF. With each signal edge of the data output control signal (OUTP), as is illustrated in FIG. 5, the data stored in the shift registers 2 are shifted toward the right by one position. The data holding elements 3 are constructed in such a way that, with the rising signal edge of the clock signal and with the falling signal edge of the clock signal CLK, they in each case accept a datum from the output of the data holding element respectively connected upstream and output it to the input of the data holding element respectively connected downstream.

Figure 6:
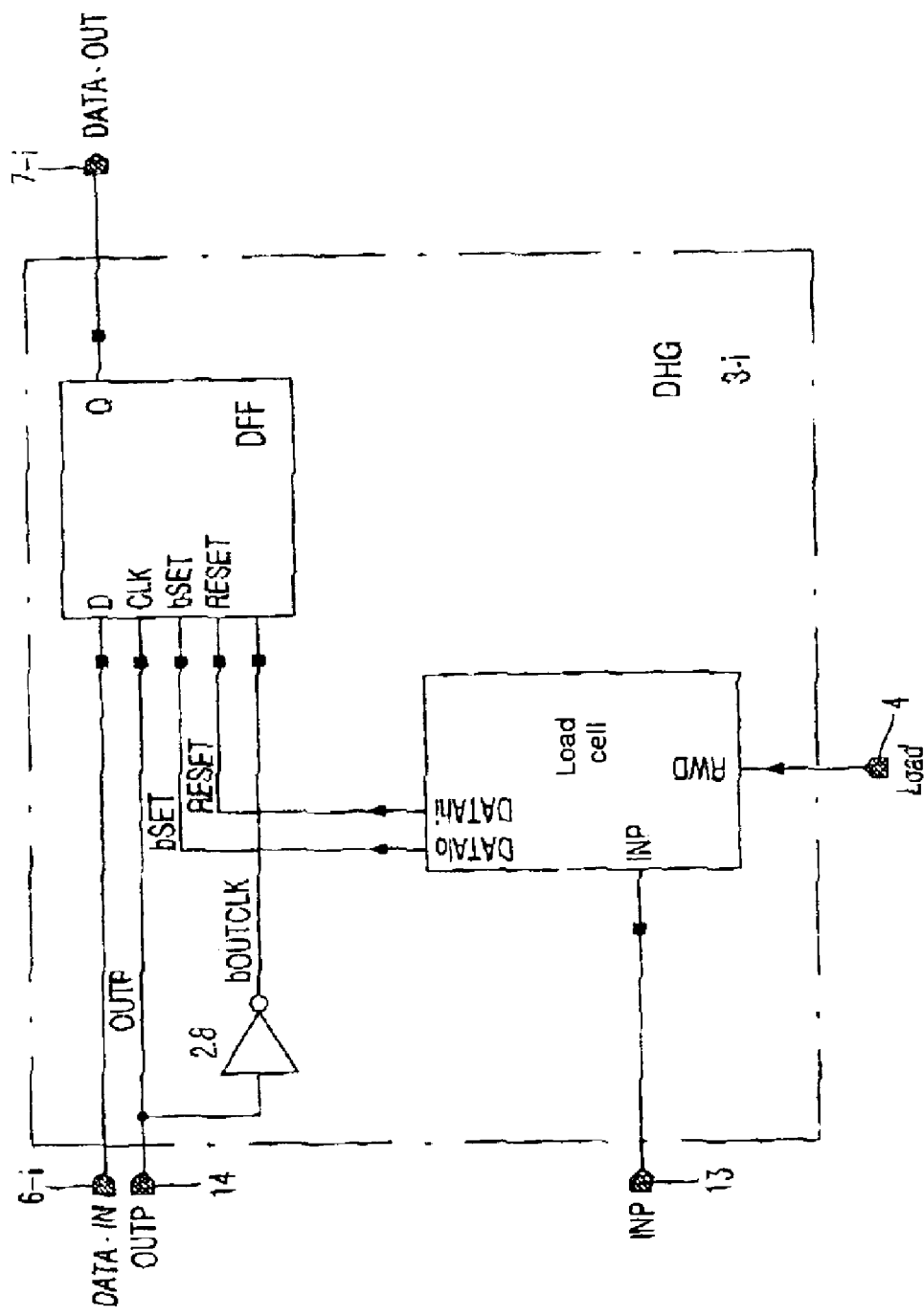
FIGS. 6–8 show a particularly preferred embodiment of a data holding element within the register according to the invention.
Figure 7:
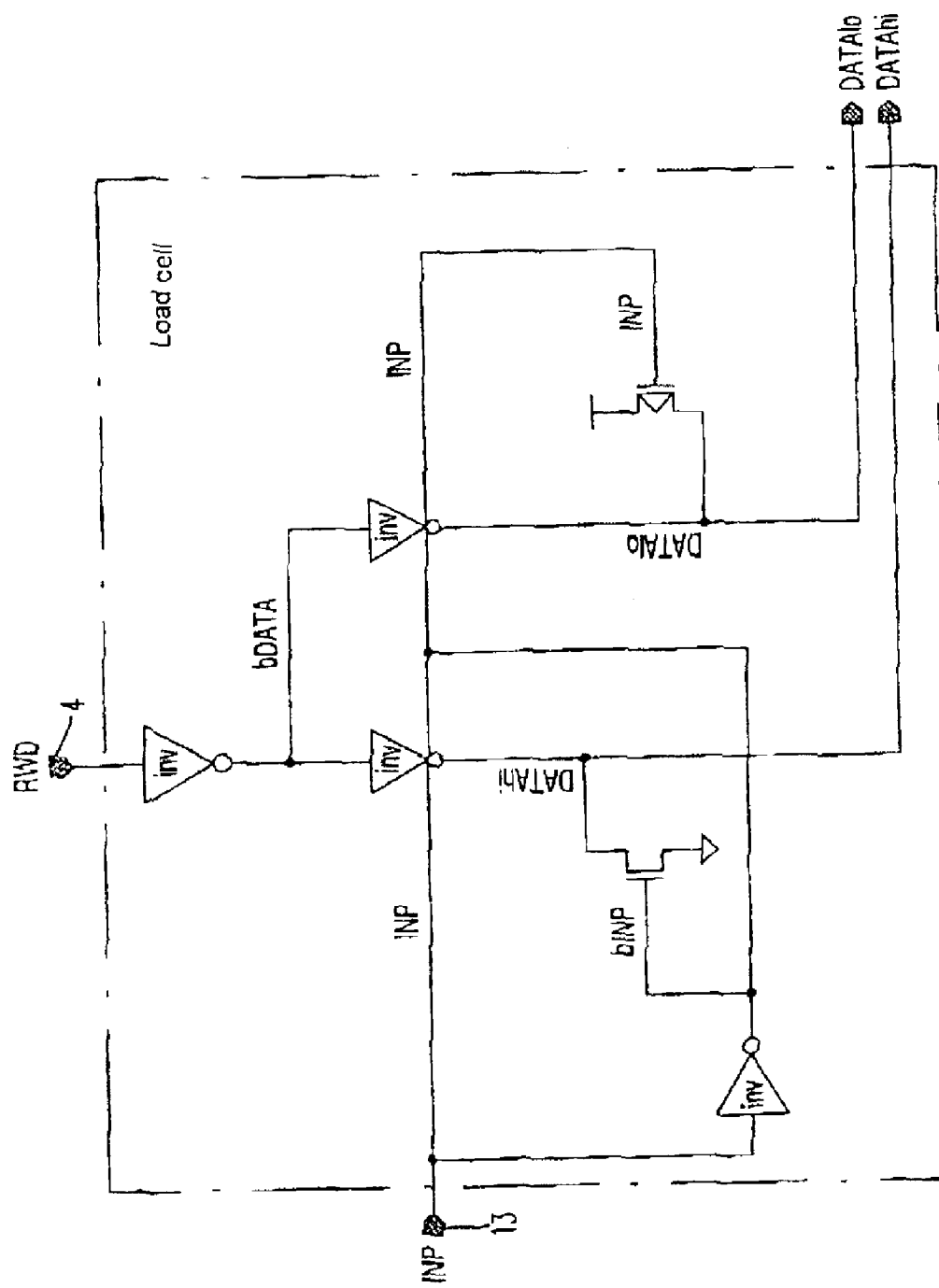
Figure 8:
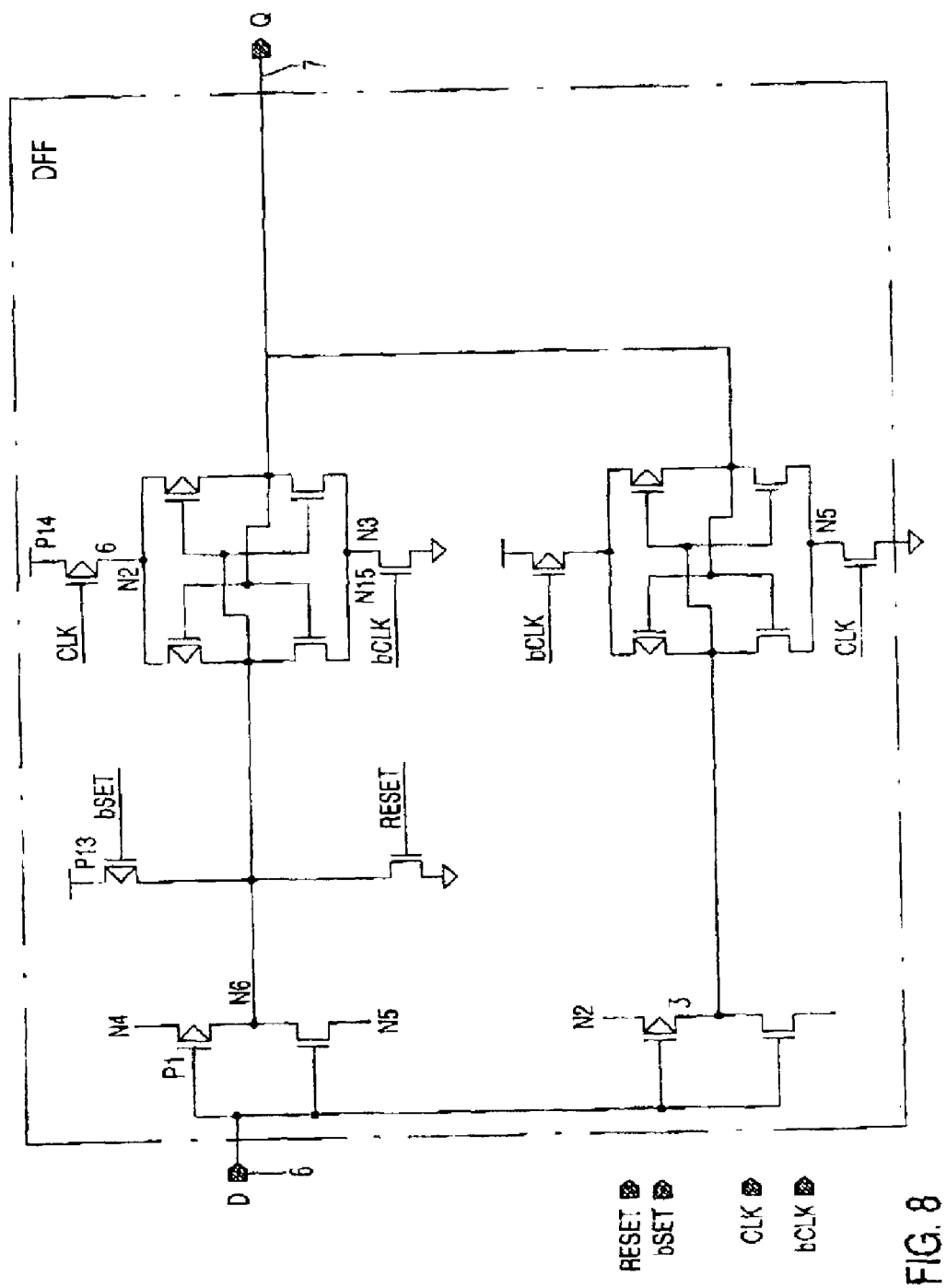

The circuitry construction of a preferred embodiment of the data holding element 3 is illustrated in detail in FIGS. 6 to 8.

The register 1 according to the invention contains a third counter 17 for cyclically enabling data signal drivers 18 via control lines 19. On the input side, the data signal drivers are connected via a line 20 to the data output of the additional data holding element 10 connected downstream of the shift register. The outputs of the data signal drivers 18 are connected via output lines 21 to a common data output line 22. The data signal drivers 18 are preferably tristate stages which can be activated by the enable signal EN present.

Figure 1:
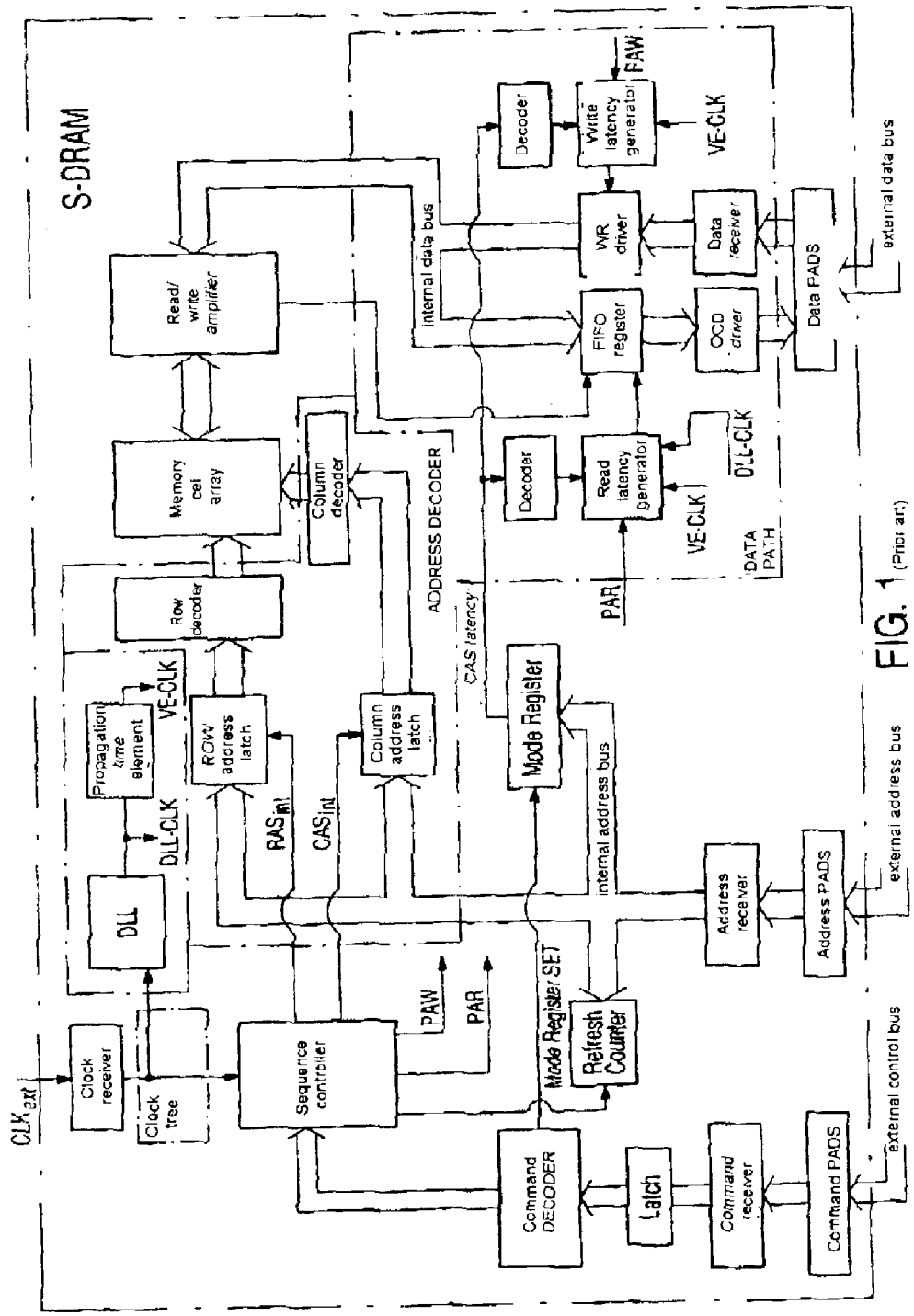
FIG. 1 shows an S-DRAM memory according to the prior art.
Figure 2:
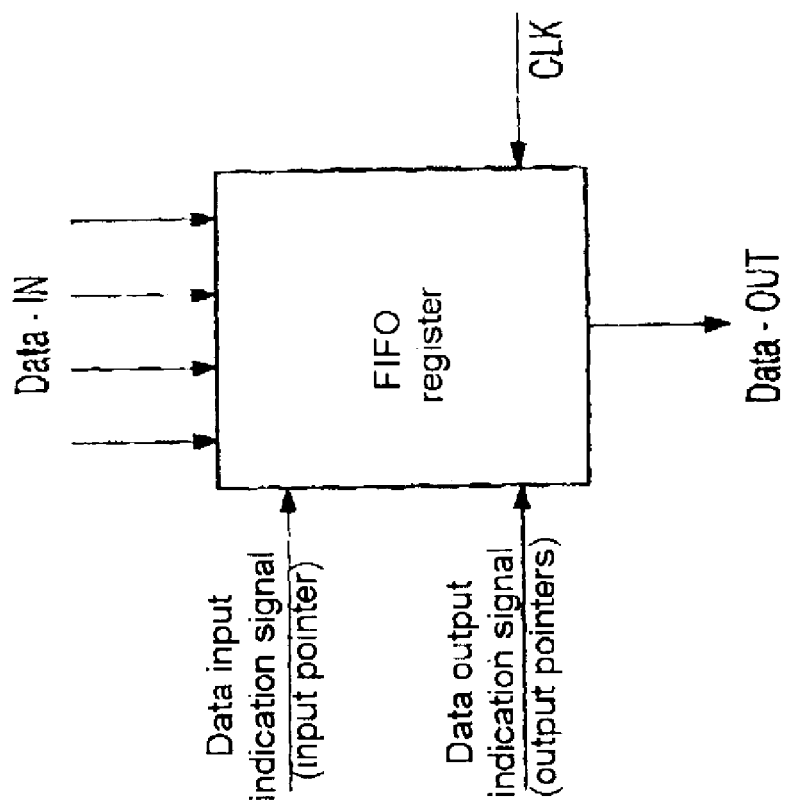
FIG. 2 shows a Fifo register according to the prior art.
Figure 3:
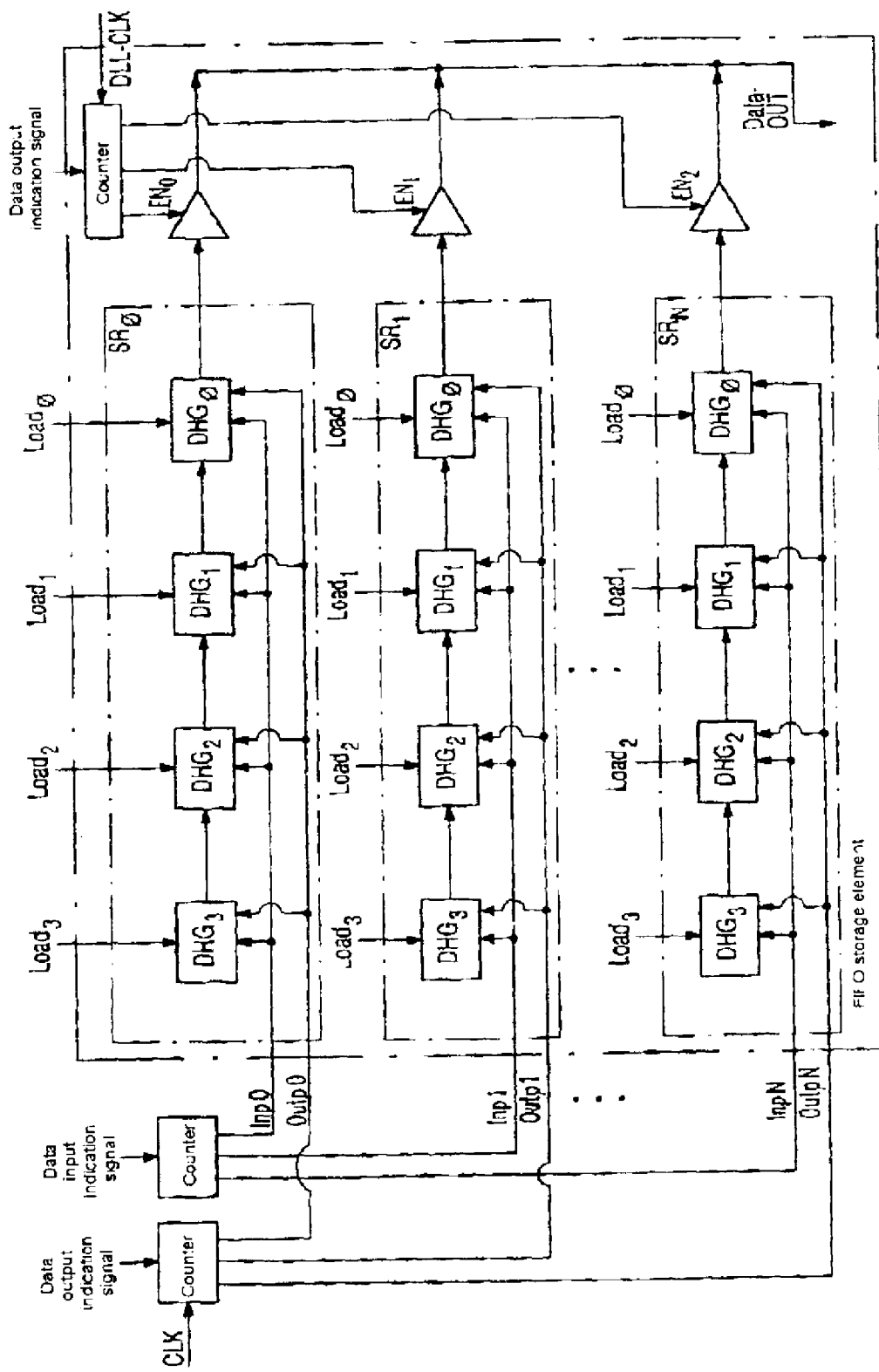
FIG. 3 shows a block diagram of a conventional Fifo register according to the prior art.

The register 1 according to the invention, as is illustrated in FIG. 4, differs from a conventional FIFO register, as is illustrated in FIG. 3, by virtue of the additional data holding elements 10 which are in each case connected downstream of a shift register 2. These additional data holding elements 3 are in each case preloaded with the datum (Load 3) for the first data holding element 3—3 of the shift register 2. In the example illustrated in FIG. 4, the data holding elements 10 accept the datum for the first data holding element 3—3 of the shift register 2 in each case upon reception of the input control signal (INP) for loading the preceding shift register. The data holding element 10 connected downstream is thus preloaded with the control loading signal for loading the preceding shift register. What is achieved as a result of this is that each data holding element 10 is in each case preloaded with that data bit output last by the shift register driven previously. This has the effect that, as soon as the enable control signal EN is applied to the associated data signal driver 18 and the latter opens, the directly preceding data value in the serial output data stream is still driven, to be precise until the data output control signal (OUTP) for the shift register is applied and drives the next data value toward the outside.

As a result of the preloading of the data holding element 10 connected downstream, imprecise signal transitions during the changeover from one shift register to the next shift register can be avoided even at very high clock rates of the clock signal.

FIG. 5 shows the output signal on the line 22, there not being any undefined data signal states between the different data eyes. The register 1 according to the invention avoids undefined data intermediate states and thus enables higher bandwidths in the case of use in an S-DRAM. The register 1 according to the invention is suitable in particular for parallel-serial conversion with very high clock frequencies of a few 100 megahertz, for example with a clock frequency of 500 MHz.

The register 1 according to the invention is suitable in particular for incorporation into the data path of a DRAM memory. The register 1 according to the invention can be connected in parallel with further identical registers 1 in parallel between data input lines of a first data bus and data output lines of a second data bus. In this case, when used in a DRAM memory, the number of output data lines is equal to the word width of the DRAM memory. The number of input data lines is preferably equal to the product of the word width of the DRAM memory and the prefetch factor thereof. In the case of incorporation into a DRAM memory, the data input indication signal for driving the first counter 15 is generated by a read/write amplifier of the DRAM memory, said data input indication signal indicating the validity of the data present on the internal data bus. When the Fifo register 1 is used in a DRAM memory, the data output indication signal for driving the second counter 16 is preferably generated by a read latency generator of the DRAM memory. The DRAM memory is preferably an S-DRAM memory.

FIGS. 6 to 8 show a particularly preferred embodiment of the data holding elements 3 contained in a Fifo register 1. A Fifo register 1 having a register depth N and a register width M contains N*(M+1) data holding elements 3, the width M being equal to the prefetch factor PF in the case of use in a DRAM memory.

FIG. 6 shows the overall circuitry construction of a data holding element 3 with a load cell and a double flip-flop (DFF). The load cell of the data holding element 3 is illustrated in detail in FIG. 7. The load cell performs the preloading of a datum that is present. The datum present at the input 4 is loaded into the interior of the double flip-flop (DFF) via the load cell and the lines bSET, RESET. The circuitry construction of the double flip-flop DFF is illustrated in detail in FIG. 8. The circuitry of the data holding element 3-i is constructed in such a way that, with the rising signal edge and with the falling signal edge, said data holding element in each case accepts a datum present at its signal input 6 from the output of the data holding element 3-i respectively connected upstream and outputs the datum via its output 7 to the data holding element 3-(i+1) respectively connected downstream.

Upon reception of the data input control signal INP at the signal input 13, the datum—present at the input 4—of a data input line is loaded and buffer-stored in the storage cell in accordance with FIG. 7. Upon reception of a data output control signal OUTP at the control input 14 of the data holding element 3-i, the buffer-stored datum is shifted toward the right to the next data holding element 3-(i+1).

LIST OF REFERENCE SYMBOLS

1 Register
2 FIFO register
3 Holding element
4 Data loading input
5 Data input lines
6 Data input
7 Data output
8 Line
9 Line
10 Data holding element
11 Control line
13 Control line
14 Control input
15 Counter
16 Counter
17 Counter
18 Signal driver
19 Control line
20 Line
21 Line
22 Data output line

What is claimed is:

1. Register for the parallel-serial conversion of data having:
   (a) a plurality of cyclically driven shift registers, each comprising series-connected data holding elements,
   (b) each data holding element being connected to a data input line;
   (c) each shift register, upon receiving an input control signal for the shift register, loading the data present on the data input lines into the data holding elements connected thereto;
   (d) each shift register, upon receiving an output control signal for the shift register, outputting the datum buffer-stored in the last data holding element of the shift register,
   wherein there is connected downstream of each shift register a further data holding element, which, upon receiving an input control signal for loading the preceding shift register, is preloaded with the datum for the first data holding element of the shift register and, upon reception of the output control signal for the shift register, outputs said preloaded datum to an output data line via a data signal driver for generating a serial output data stream with unambiguous data signal states.

2. Register according to claim 1, wherein the input control signals for the shift registers are generated by a first counter, the first counter outputting input control signals to the shift registers after the reception of a data input indication signal which indicates the presence of valid data on the data input lines.

3. Register according to claim 1, wherein the output control signals for the shift registers are generated by a second counter, the second counter outputting the output control signals to the shift registers after the reception of a data output indication signal.

4. Register according to claim 1, wherein the data signal drivers are tristate stages which are activated by enable signals.

5. Register according to claim 1, wherein the enable signals for the data signal drivers are generated by a third counter, which outputs the enable signals to the data signal drivers after the reception of the data output indication signal.

6. Register according to claim 1, wherein the input control signals for the shift registers in each case comprise a signal pulse for loading the data present on the data input lines.

7. Register according to claim 1, wherein the counters are clocked with a clock signal.

8. Register according to claim 1, wherein, in each case with the rising signal edge and with the falling signal edge of the output control signal, the data holding elements accept a datum from the output of the data holding element respectively connected upstream and output it to the input of the data holding element respectively connected downstream.

9. Register according to claim 1, wherein the number of series-connected data holding elements of a shift register is equal to the number of connected data input lines.

10. Register according to claim 1, wherein the register can be connected in parallel with further registers between data input lines of a first data bus and data output lines of a second data bus.

11. Register according to claim 10, wherein the first data bus is an internal data bus of a DRAM memory.

12. Register according to claim 10, wherein the second data bus applies the serial output data streams to a driver circuit of the DRAM memory via output data lines.

13. Register according to claim 12, wherein the number of output data lines is equal to the word width of the DRAM memory.

14. Register according to claim 1, wherein the number of input data lines is equal to the product of the word width of the DRAM memory and a prefetch factor of the DRAM memory.

15. Register according to claim 1, wherein the data input indication signal is generated by a read/write amplifier of the DRAM memory.

16. Register according to claim 1, wherein the data output indication signal is generated by a read latency generator of the DRAM memory.

17. Register according to claim 1, wherein the output control signals for the shift registers in each case comprise a sequence of pulses, the number of pulses being equal to half the number of series-connected data holding elements of the shift register.

18. Register according to claim 1, wherein the number of series-connected data holding elements of a shift register is equal to the prefetch factor of the DRAM memory.

19. Register according to claim 18, wherein the DRAM memory is an S-DRAM memory.

20. Register according to claim 1, wherein the clock signal has a clock rate of a few 100 MHz.

21. D-RAM memory having a register for the parallel-serial conversion of data according to claim 1.

22. Use of a register according to claim 1 for the parallel-serial conversion of data in a data path of a DRAM memory.

* * * * *